United States Patent
Li et al.

(10) Patent No.: US 11,475,926 B1
(45) Date of Patent: Oct. 18, 2022

(54) SENSE AMPLIFIER CIRCUIT FOR CURRENT SENSING

(71) Applicant: GLOBALFOUNDRIES U.S. Inc., Malta, NY (US)

(72) Inventors: Xiaoxiao Li, Shanghai (CN); Xiaoli Hu, Shanghai (CN); Shuangdi Zhao, Shanghai (CN); Xi Cao, Dublin, CA (US); Wei Zhao, Shanghai (CN); Xueqiang Dai, Nanjing (CN)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 17/344,133

(22) Filed: Jun. 10, 2021

(51) Int. Cl.
  *G11C 7/02* (2006.01)
  *G11C 7/06* (2006.01)
  *G11C 7/08* (2006.01)

(52) U.S. Cl.
  CPC ............... *G11C 7/062* (2013.01); *G11C 7/08* (2013.01)

(58) Field of Classification Search
  CPC ...................... G11C 7/062; G11C 7/08
  USPC ........................................................... 365/208
  See application file for complete search history.

(56) References Cited

U.S. PATENT DOCUMENTS

| 10,181,354 B2 | 1/2019 | Sheng et al. |
| 10,199,109 B2 | 2/2019 | Qian et al. |
| 2004/0190334 A1* | 9/2004 | Baker ............... G11C 7/062 365/158 |
| 2016/0351267 A1* | 12/2016 | Tran .................. G11C 8/10 |
| 2020/0211610 A1 | 7/2020 | Huang et al. |

* cited by examiner

*Primary Examiner* — Huan Hoang
(74) *Attorney, Agent, or Firm* — David Cain; Andrew M. Calderon; Calderon Safran & Cole, P.C.

(57) ABSTRACT

The present disclosure relates to integrated circuits, and more particularly, to a sense amplifier circuit for current sensing in a memory structure and methods of manufacture and operation. In particular, the present disclosure relates to a circuit including: a sensing circuit including a first set of transistors, at least one data cell circuit, and a reference cell circuit; a reference voltage holding circuit comprising a second set of transistors and a bitline capacitor; and a comparator differential circuit which receives a data sensing voltage signal from the sensing circuit and a reference voltage level from the reference voltage holding circuit and outputs an output signal.

20 Claims, 3 Drawing Sheets

SENSE AMPLIFIER CIRCUIT FOR CURRENT SENSING

FIELD OF THE INVENTION

The present disclosure relates to integrated circuits, and more particularly, to a sense amplifier circuit for current sensing in a memory structure and methods of manufacture and operation.

BACKGROUND

In memory, a sense amplifier is one of the elements which make up the circuitry on a semiconductor memory chip. The sense amplifier is part of a read circuitry that is used when data is read from the memory. The sense amplifier senses low power signals from a bitline that represents a data bit (1 or 0) stored in a memory cell, and amplifies a small voltage swing to recognizable logic levels so that the data can be integrated by logic outside of the memory.

In a static random-access memory (SRAM) operation, in order to read a bit from a particular memory cell a wordline along the particular memory cell's row is turned on, which activates all of the cells in the row. The stored value (0 or 1) from the particular memory cell is then sent to the bitlines associated with the particular memory cell. The sense amplifier at the end of two complimentary bitlines amplifies small voltages to normal logic level. The bit from the desired cell is then latched from the particular memory cell's sense amplifier into a buffer, and placed on an output bus.

In a dynamic random-access memory (DRAM) operation, the sense amplifier is similar to SRAM, but performs an additional function. Specifically, the data in DRAM chips is stored as electric charge in capacitors in memory cells. The read operation depletes the charge in a cell, destroying the data, so after the data is read out, the sense amplifier must immediately write it back in the cell by applying a voltage to it (i.e., memory refresh). In known circuits as described above, a large amount of area is used and a large amount of power is consumed.

SUMMARY

In an aspect of the disclosure, a structure comprises: a sensing circuit comprising a first set of transistors configured to sense a current difference between a reference cell current and a current from a selected one of a first data cell circuit and a second data cell circuit, and output the current difference as a data sensing voltage signal to a differential circuit; and a reference voltage holding circuit comprising a second set of transistors configured to hold a reference voltage level and output the reference voltage level to the differential circuit.

In another aspect of the disclosure, a structure comprises: a sensing circuit comprising a first set of transistors, at least one data cell circuit, and a reference cell circuit; a reference voltage holding circuit comprising a second set of transistors and a bitline capacitor; and a comparator differential circuit which receives a data sensing voltage signal from the sensing circuit and a reference voltage level from the reference voltage holding circuit and outputs an output signal.

In another aspect of the disclosure, a method comprises: selecting one of a first data cell circuit and a second data cell circuit using a sensing circuit; converting a current difference between a reference cell current of a reference cell circuit and a current from a selected one of the first data cell circuit and the second data cell circuit to a data sensing voltage signal using the sensing circuit; holding a reference voltage level using a reference voltage holding circuit; and outputting the data sensing voltage signal and the reference voltage level to a differential comparator circuit.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to integrated circuits, and more particularly, to a sense amplifier circuit for current sensing in a memory structure and methods of manufacture and operation. More specifically, the present disclosure relates to a sense amplifier circuit for a current sensing memory system. In embodiments, the sense amplifier circuit includes a simplified reference path for reference voltage holding and leakage/loading matching and a sensing path for selecting between a top and a bottom array. In this way, there is no need to power up the bitline switch of an unselected bank, which saves total read power. Advantageously, the structures described herein save approximately 50% area of differential sense amplifiers and save about approximately 25% of total read power.

In known circuits, a reference voltage is stored on one branch and a data sensing voltage is simultaneously developed on another branch. These two branches are compared using differential sensing. The circuit also uses a symmetrical path to provide an input to a comparator. In other known circuits, time interleaving is used to generate a reference voltage, store the reference voltage on a capacitor, and then generates a data sensing voltage. The reference voltage and data sensing voltage are then compared. However, in comparison to the present disclosure, the known circuits of a sense amplifier with a bit line pre-charge circuit for reading flash memory cells in an array use a lot of area (e.g., double the area in comparison to the present disclosure) and consume a lot of power for current to voltage amplification in memory systems. In particular, known circuits of the sense amplifier with the bit line pre-charge circuit for reading flash memory cells in the array consume extra power (e.g., 4/3 the amount of power in comparison to the present disclosure) to turn on the bitline switch in the unselected bank. In contrast, the sense amplifier circuit comprises an eflash sense amplifier with single current to voltage amplification path which does not require simultaneous dual branch circuit paths, extra test circuit logic, time interleaving, and extra power consumption when turning on an unselected bank.

Figure 1:
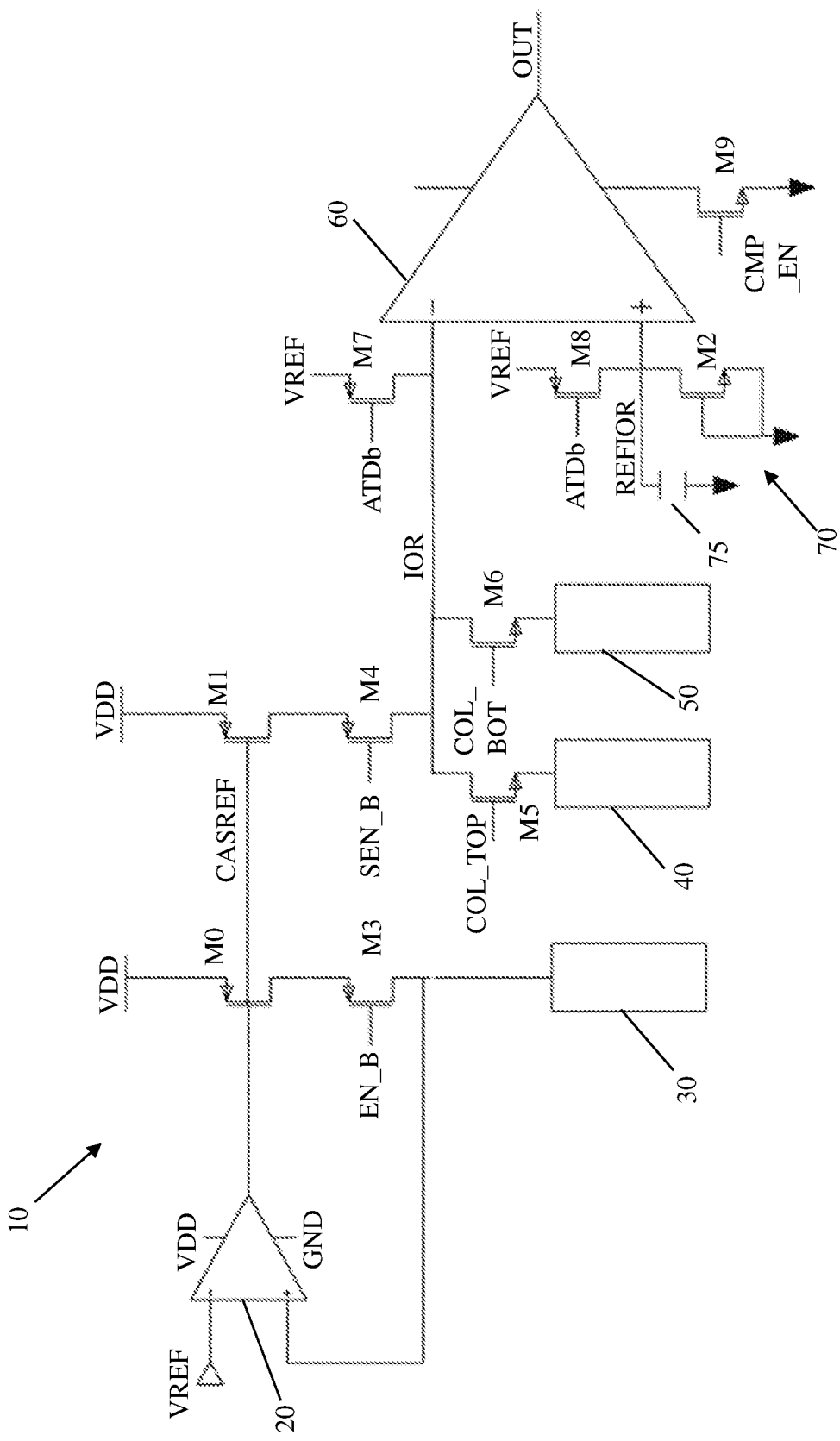
FIG. 1 shows a sense amplifier circuit for current sensing in a memory structure in accordance with aspects of the present disclosure.

FIG. 1 shows a sense amplifier circuit for current sensing in a memory structure in accordance with aspects of the present disclosure. The sense amplifier circuit 10 includes comparators 20, 60, a reference cell circuit 30, data cell circuits 40, 50, a reference voltage holding circuit 70, capacitor 75, and transistors M0 through M9. The reference voltage holding circuit 70 includes the transistors M2, M8, and the capacitor 75. The transistors M0, M1, M3, M4, M7, and M8 may be p-type metal-oxide-semiconductor (PMOS) transistors, while the transistors M2, M5, M6, and M9 may be n-type metal-oxide-semiconductor (NMOS) transistors.

In operation, the comparator 20 receives a reference voltage VREF and a feedback signal from a drain of the transistor M3 and outputs a signal to a gate of the transistor M0. The feedback signal from the drain of the transistor M3 can be used to convert a current of the reference voltage VREF to a sensing reference cell signal CASREF. In particular, the feedback signal (i.e., negative feedback loop) forces the drain of the transistor M3 to track the reference voltage VREF, and provides driving ability on the sensing reference cell signal CASREF. Thus, the transistors M0, M1 can carry the reference cell current which is generated by the reference cell circuit 30 biased at a proper voltage level. A source of the transistor M0 receives a first power supply voltage VDD and a drain of the transistor M0 is connected to a source of the transistor M3. A gate of the transistor M3 may be connected to an enable signal EN_B and a drain of the transistor M3 may be connected to a reference cell circuit 30.

In FIG. 1, a gate of the transistor M1 may be connected to the sensing reference cell signal CASREF. A source of the transistor M1 may be connected to the first power supply voltage VDD and a drain of the transistor M1 may be connected to a source of the transistor M4. The transistor M1 carries a reference cell current of the reference cell circuit 30. Further, the reference cell current is transmitted to the first input/output resolving signal IOR during a sensing operation.

A gate of the transistor M4 may be connected to a sensing signal SEN_B and a drain of the transistor M4 may be connected to a first input/output resolving signal IOR (e.g., a data sensing voltage signal). A drain of the transistor M5 and a drain of the transistor M6 may also be connected to the first input/output resolving signal IOR.

A gate of the transistor M5 may be connected to a column top signal COL_TOP and a source of the transistor M5 may be connected to the data cell circuit 40. A gate of the transistor M6 may be connected to a column bottom signal COL_BOT and a source of the transistor M6 may be connected to the data cell circuit 50. In particular, the column top signal COL_TOP enables the data cell circuit 40 to be selected, while the column bottom signal COL_BOT enables the data cell circuit 50 to be selected. Therefore, one of the column top signal COL_TOP and the column bottom signal COL_BOT may be enabled at one time to select one of the corresponding data cell circuit 40 and the data cell circuit 50.

Still referring to FIG. 1, a gate of the transistor M7 may be connected to a control signal ATDb. A source of the transistor M7 may be connected to a reference voltage VREF and a drain of the transistor M7 is connected to the first input/output resolving signal IOR. A drain of the transistor M9 may be connected to the comparator 60 and a source of the transistor M9 may be connected to ground GND. A gate of the transistor M9 may be connected to a comparison enable signal CMP_EN. In operation, after enough current is accumulated in the first input/output resolving signal IOR, the comparison enable signal CMP_EN may be turned on and the comparator 60 may then be enabled. The comparator 60 receives the first input/output resolving signal IOR (e.g., the data sensing voltage signal) and a second input/output resolving signal REFIOR (e.g., a reference voltage level) and outputs an output signal OUT when the comparator 60 is enabled (i.e., when the comparison enable signal CMP_EN enables the gate of the transistor M9, and therefore enables the comparator 60). The reference voltage holding circuit 70 includes the transistors M2, M8 and the capacitor 75 and will described in further detail in FIG. 2.

In the operation of FIG. 1, there are two input paths to the comparator 60. In a first path for the first input/output resolving signal IOR, a current difference between the reference cell circuit 30 and a selected data cell circuit (i.e., a selected data cell circuit of the data cell circuits 40, 50) are converted to voltage. Therefore, the first path for the first input/output resolving signal IOR implements a current to voltage conversion. The first path for the first input/output resolving signal IOR also removes a multiplexer for a bottom or top bank selection within a sense amplifier compared to known circuits.

In a second path for the second input/output resolving signal REFIOR, a reference voltage level (VREF) is kept (i.e., held). Further, the second path for the second input/output resolving signal REFIOR removes logic for test circuits, removes a reference current leg, and removes a voltage clamp compared to known circuits. Therefore, the second path for the second input/output resolving signal REFIOR has less devices than known circuits to save area and read power. Then, the comparator 60 compares the first path and the second path and outputs the output signal OUT.

In further operation, if a current from a selected data cell circuit (i.e., a selected data cell circuit of the data cell circuits 40, 50) is equal to a reference cell current in the transistor M1, then the first input/output resolving signal IOR is kept at a reference voltage level (VREF) as same as the second input/output resolving signal REFIOR. If the current from the selected data cell circuit (i.e., a selected data cell circuit of the data cell circuits 40, 50) is greater than the reference cell current in the transistor M1, then the first input/output resolving signal IOR is pulled down to a low level (e.g., pulled down to ground GND). If the current from the selected data cell circuit (i.e., a selected data cell circuit of the data cell circuits 40, 50) is less than the reference cell current in the transistor M1, then the first input/output resolving signal IOR is pulled up to a high level (e.g., pulled up to the first power supply voltage VDD). In other words, the first input/output resolving signal IOR generates a current different between the reference cell current in the transistor M1 and the current from the selected data cell circuit (i.e., a selected data cell circuit of the data cell circuits 40, 50).

Figure 2:
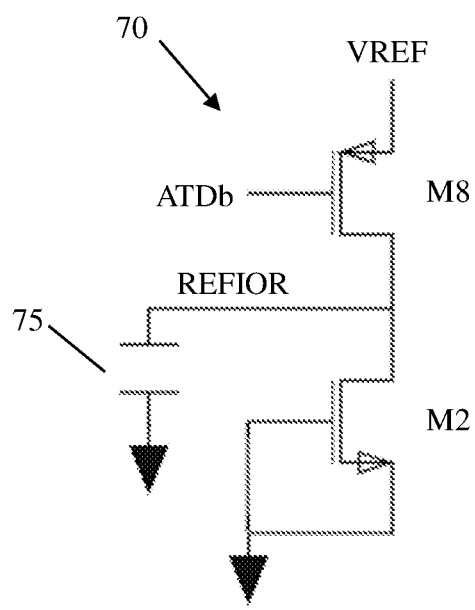
FIG. 2 shows a reference voltage holding circuit for the sense amplifier circuit in the memory structure in accordance with aspects of the present disclosure.

FIG. 2 shows a reference voltage holding circuit for the sense amplifier circuit in the memory structure. The reference voltage holding circuit 70 includes the transistor M8 with a gate connected to the control signal ATDb. A source of the transistor M8 may be connected to the voltage reference VREF and a drain of the transistor M8 may be connected to a drain of the transistor M2. The drain of the transistor M2 may be connected to the capacitor 75. A gate of the transistor M2 may be connected to the source of the transistor M2. Further, the gate and source of the transistor M2 may be connected to ground. Therefore, the transistor M2 can be off to mimic the leakage of the off multiplexer devices on the side of the first input/output resolving signal IOR.

In the operation, the M8 transistor may be controlled by the control signal ATDb for pre-charging the second input/output resolving signal REFIOR to the voltage reference VREF. Also, a value of the capacitor 75 may be equivalent to a total loading of the data cell circuits 40, 50 on a bitline.

The capacitor 75 can be a metal capacitance (e.g., top level of the metal), and may not be a real bitcell. The capacitor 75 can hold a voltage reference VREF level on the second input/output resolving signal REFIOR after the pre-charging of the second input/output resolving signal REFIOR to the voltage reference VREF turns off.

The capacitor 75 can also match a coupling effect from the control signal ATDb being a high level to the bitline on the first path for the first input/output resolving signal IOR. The transistor M2 may be identical in size to the transistors M5 and M6 in FIG. 1 to match the leakage of the one of the transistors M5 and M6 (i.e., the one of the transistors M5 and M6 which is turned off) on the first path for the first input/output resolving signal IOR. For example, when the transistor M5 is turned on by the column top signal COL_TOP being a high level and the transistor M6 is turned off by the column bottom signal COL_BOT being a low level, the transistor M2 has leakage matching to the leakage of the transistor M6 when the transistor M6 is turned off.

Further, when the transistor M6 is turned on by the column bottom signal COL_BOT being a high level and the transistor M5 is turned off by the column top signal COL_TOP being a low level, the transistor M2 has leakage matching to the leakage of the transistor M5 when the transistor M5 is turned off. Therefore, all of the leakage and coupling effects are eliminated with the capacitor 75 and the transistor M2. Also, by eliminating the leakage and coupling effects with the capacitor 75 and the transistor M2, a current delta between the first input/output resolving signal IOR and the second input/output resolving signal REFIOR can be a pure current delta between the reference cell circuit 30 and the selected data cell circuit (i.e., a selected data cell circuit of the data cell circuits 40, 50).

Figure 3:
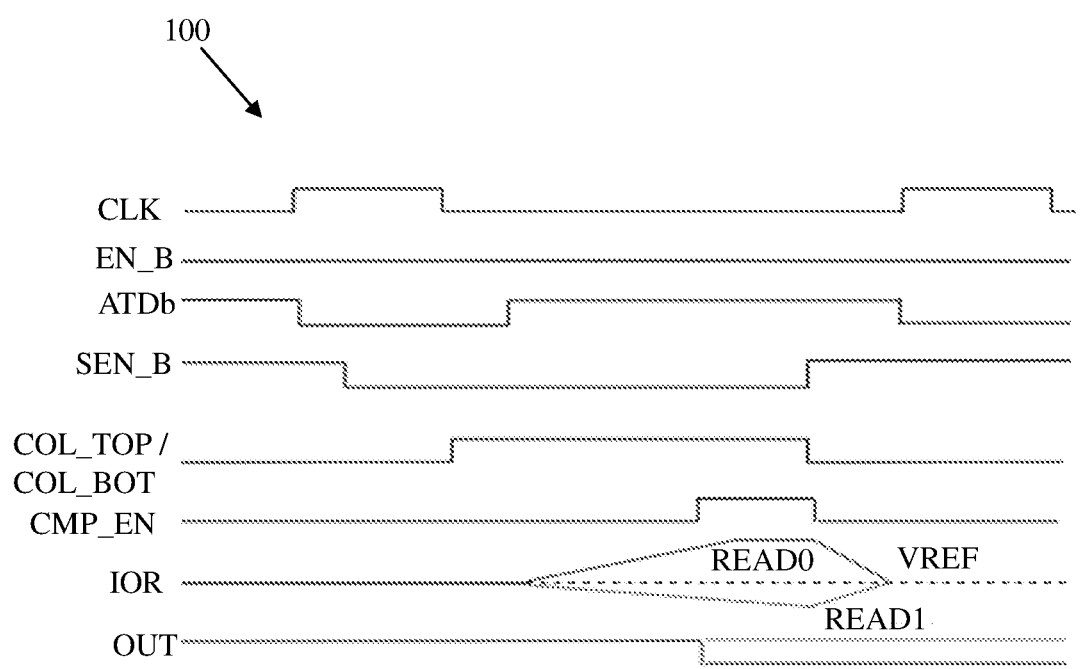
FIG. 3 shows a timing graph of the sense amplifier circuit in the memory structure in accordance with aspects of the present disclosure.

FIG. 3 shows a timing graph of the sense amplifier circuit in the memory structure. The timing graph 100 includes the clock signal CLK, the enable signal EN_B, the control signal ATDb, the sensing signal SEN_B, the column top signal COL_TOP/the column bottom signal COL_BOT, the comparison enable signal CMP_EN, the first input/output resolving signal IOR, and the output signal OUT. In the timing graph 100, the enable signal EN_B stays low after chip power-up to settle the close-loop operational amplifier and obtain a steady column address sensing reference cell signal CASREF. As shown, the control signal ATDb works as a precharge signal at the beginning of each read operation. For example, when the control signal ATDb is low (e.g., is "0"), both the first input/output resolving signal IOR and the second input/output resolving signal REFIOR are pre-charged to the voltage reference VREF level.

Still referring to the timing graph 100, the sensing signal SEN_B and the column top signal COL_TOP/the column bottom signal COL_BOT (i.e., one of the column top signal COL_TOP and the column bottom signal COL_BOT) should be on before pre-charge ends, to assure that both the pull up from the reference cell current and pull down from the selected data cell circuit (i.e., a selected data cell circuit of the data cell circuits 40, 50) exists on the first path for the first input/output resolving signal IOR. Once the pre-charge ends, the difference on currents will pull up or pull down the first input/output resolving signal IOR and deviate from the pre-charged voltage reference VREF level.

For example, in the timing graph 100, if the selected data cell circuit (i.e., a selected data cell circuit of the data cell circuits 40, 50) stores a zero, the current from the selected data cell circuit (i.e., a selected data cell circuit of the data cell circuits 40, 50) is less than the reference cell current in the transistor M1, and the first input/output resolving signal IOR is pulled up to a high level (e.g., pulled up to the first power supply voltage VDD). In this scenario, if the selected data cell circuit stores a "0", the output signal OUT is at a low level (e.g., "0" or GND). However, if the selected data cell circuit (i.e., a selected data cell circuit of the data cell circuits 40, 50) stores a one ("1"), the current from the selected data cell circuit (i.e., a selected data cell circuit of the data cell circuits 40, 50) will be greater than the reference cell current in the transistor M1, and the first input/output reference signal IOR may be pulled down to a low level (e.g., pulled down to ground GND). In this scenario, if the selected data cell circuit stores a "1", the output signal OUT is at a high level (e.g., "1" or VDD).

As also shown in the timing graph 100, once sufficient delta is accumulated between the first input/output resolving signal IOR and the second input/output resolving signal REFIOR, the comparator 60 starts comparing the first input/output resolving signal IOR and the second input/output resolving signal REFIOR and outputs the output signal OUT. In the present disclosure, the second path for the second input/output resolving signal REFIOR lacks a bitcell leakage so the second input/output resolving signal REFIOR has a higher level than the known circuits. Further, the first path for the first input/output resolving signal IOR may have a leaky passgate on the transistors M5 and M6, so the first input/output resolving signal IOR may have a lower level than the known circuits. Therefore, the circuit described herein has a larger voltage margin (i.e., higher level of the second input/output reference signal REFIOR and lower level of the first input/output reference signal IOR) when the read value is "1" than known circuits. In particular, statistical analysis shows five sigma on read 1 margin and eight sigma on read 0 margin, which allows for a very robust application.

The sense amplifier circuit can be manufactured in a number of ways using a number of different tools. In general, though, the methodologies and tools are used to form structures with dimensions in the micrometer and nanometer scale. The methodologies, i.e., technologies, employed to manufacture the sense amplifier circuit has been adopted from integrated circuit (IC) technology. For example, the sense amplifier circuit may be built on wafers and realized in films of material patterned by photolithographic processes on the top of a wafer. In particular, the fabrication of the sense amplifier circuit uses three basic building blocks: (i) deposition of thin films of material on a substrate, (ii) applying a patterned mask on top of the films by photolithographic imaging, and (iii) etching the films selectively to the mask.

The sense amplifier circuit for current sensing in a memory structure can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as Smartphones) and edge computing markets. SoC is also commonly used in embedded systems and the Internet of Things.

The structures and methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A circuit, comprising:
   a sensing circuit comprising a first set of transistors, at least one data cell circuit, and a reference cell circuit;
   a reference voltage holding circuit comprising a second set of transistors and a bitline capacitor; and
   a comparator differential circuit which receives a data sensing voltage signal from the sensing circuit and a reference voltage level from the reference voltage holding circuit and outputs an output signal.

2. The circuit of claim 1, wherein the sensing circuit is configured to select one of a first data cell circuit and a second data cell circuit of the at least one data cell circuit, convert a current difference between a reference cell current of the reference cell circuit and a current from a selected one of the first data cell circuit and the second data cell circuit to the data sensing voltage signal, and output the data sensing voltage signal.

3. The circuit of claim 2, wherein the reference voltage holding circuit is configured to hold and output the reference voltage level, and match leakage of an unselected one of the first data cell circuit and the second data cell circuit of the at least one data cell circuit.

4. The circuit of claim 3, wherein the second set of transistors comprises a NMOS transistor configured to match the leakage of the unselected one of the first data cell circuit and the second data cell circuit.

5. The circuit of claim 1, wherein the second set of transistors comprises a PMOS transistor configured to pre-charge to the reference voltage level.

6. The circuit of claim 5, wherein the bitline capacitor is configured to hold the reference voltage level after the pre-charge is turned off.

7. The circuit of claim 1, wherein the first set of transistors comprises a PMOS circuit configured to receive a reference cell current of the reference cell circuit.

8. The circuit of claim 1, further comprising a sense amplifier circuit which comprises the sensing circuit and the reference voltage holding circuit.

9. A structure, comprising:
   a sensing circuit comprising a first set of transistors configured to sense a current difference between a reference cell current and a current from a selected one of a first data cell circuit and a second data cell circuit, and output the current difference as a data sensing voltage signal to a differential circuit; and
   a reference voltage holding circuit comprising a second set of transistors configured to hold a reference voltage level and output the reference voltage level to the differential circuit.

10. The structure of claim 9, wherein the reference voltage holding circuit comprises a PMOS transistor of the second set of transistors configured to pre-charge to the reference voltage level.

11. The structure of claim 10, wherein the reference voltage holding circuit comprises a capacitor configured to hold the reference voltage level after the pre-charge is turned off.

12. The structure of claim 9, wherein the reference voltage holding circuit comprises a NMOS transistor of the second set of transistors configured to match leakage of an unselected one of the first data cell circuit and the second data cell circuit.

13. The structure of claim 9, wherein the sensing circuit comprises a PMOS transistor of the first set of transistors configured to receive the reference cell current of the reference cell circuit.

14. The structure of claim 9, wherein the sensing circuit comprises a comparator which receives the reference voltage level and a feedback signal connected to the reference cell circuit.

15. The structure of claim 9, wherein the sensing circuit comprises five PMOS transistors and two NMOS transistors of the first set of transistors.

16. The structure of claim 9, wherein the differential circuit is a comparator differential circuit which receives the data sensing voltage signal and the reference voltage level and outputs an output signal.

17. The structure of claim 16, wherein the comparator differential circuit is enabled by a comparator enable signal gated to a NMOS transistor connected to the comparator differential circuit.

18. The structure of claim 17, wherein the comparator enable signal is a high level in response to a predetermined current delta being accumulated between the data sensing voltage signal and the reference voltage level.

19. The structure of claim 9, wherein the sensing circuit and the reference voltage holding circuit comprise part of a sense amplifier circuit.

20. A method, comprising:
    selecting one of a first data cell circuit and a second data cell circuit using a sensing circuit;
    converting a current difference between a reference cell current of a reference cell circuit and a current from a selected one of the first data cell circuit and the second data cell circuit to a data sensing voltage signal using the sensing circuit;
    holding a reference voltage level using a reference voltage holding circuit; and
    outputting the data sensing voltage signal and the reference voltage level to a differential comparator circuit.

* * * * *